United States Patent
Devos

(10) Patent No.: US 7,106,208 B2
(45) Date of Patent: Sep. 12, 2006

(54) PRINTED SENSOR HAVING OPPOSED AREAS OF NONVISIBLE CONDUCTIVE INK

(75) Inventor: John A. Devos, Corvalis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 331 days.

(21) Appl. No.: 10/656,938

(22) Filed: Sep. 5, 2003

(65) Prior Publication Data
US 2005/0076548 A1    Apr. 14, 2005

(51) Int. Cl.
G08B 21/00    (2006.01)

(52) U.S. Cl. .................. 340/686.1; 340/686.6; 40/124.01

(58) Field of Classification Search ........... 340/686.1, 340/686.6; 40/124, 124.1, 24.01, 359, 457; 200/457, 458, 332
See application file for complete search history.

(56) References Cited

U.S. PATENT DOCUMENTS

| | | | |
|---|---|---|---|
| 3,592,098 A | 7/1971 | Zadig | |
| 4,363,081 A | 12/1982 | Wilbur | |
| 4,683,360 A | 7/1987 | Maser | |
| 4,818,827 A | 4/1989 | Ipcinski et al. | |
| 5,167,508 A | 12/1992 | McTaggart | |
| 5,200,268 A * | 4/1993 | Hamada | 428/354 |
| 5,356,296 A | 10/1994 | Pierce et al. | |
| 5,484,292 A | 1/1996 | McTaggart | |
| 5,524,490 A | 6/1996 | Lautzenhiser et al. | |
| 5,541,570 A | 7/1996 | McDowell | |
| 5,565,658 A | 10/1996 | Gerpheide et al. | |
| 5,597,183 A | 1/1997 | Johnson | |
| 5,609,488 A | 3/1997 | McTaggart | |
| 5,654,640 A * | 8/1997 | Bailey | 324/435 |
| 5,772,208 A | 6/1998 | McTaggart | |
| 5,791,648 A | 8/1998 | Hohl | |
| 5,803,748 A | 9/1998 | Maddrell et al. | |
| 5,810,604 A | 9/1998 | Kopp, Jr. et al. | |
| 5,942,733 A | 8/1999 | Allen et al. | |
| 5,989,700 A | 11/1999 | Krivopal | |
| 5,997,044 A | 12/1999 | Behm et al. | |
| 6,002,389 A | 12/1999 | Kasser | |
| 6,021,306 A | 2/2000 | McTaggart | |
| 6,041,215 A | 3/2000 | Maddrell et al. | |
| 6,104,306 A | 8/2000 | Hogue et al. | |
| 6,118,426 A | 9/2000 | Albert et al. | |
| 6,124,851 A | 9/2000 | Jacobson | |
| 6,167,233 A | 12/2000 | Gresser, Jr. et al. | |
| 6,188,391 B1 | 2/2001 | Seely et al. | |
| 6,205,690 B1 | 3/2001 | Heropoulos et al. | |
| 6,222,525 B1 | 4/2001 | Armstrong | |
| 6,283,374 B1 * | 9/2001 | Fantone et al. | 235/462.45 |
| 6,297,811 B1 | 10/2001 | Kent et al. | |
| 6,329,044 B1 | 12/2001 | Inoue et al. | |
| 6,377,009 B1 | 4/2002 | Philipp | |
| 6,421,524 B1 | 7/2002 | Padgett | |
| 6,503,831 B1 | 1/2003 | Speakman | |

* cited by examiner

Primary Examiner—Anh V. La

(57) ABSTRACT

A sensor/switching device configuration that includes a substrate and at least one element imprinted on the substrate containing an electroconductive material.

48 Claims, 3 Drawing Sheets

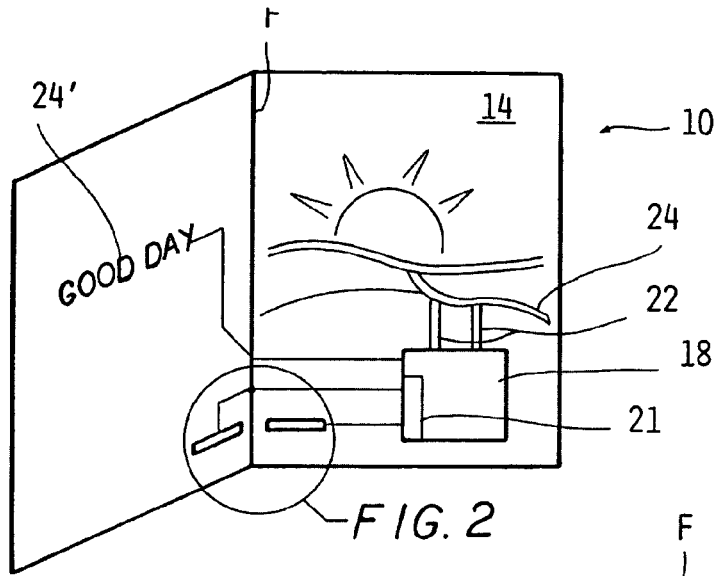
FIG. 1
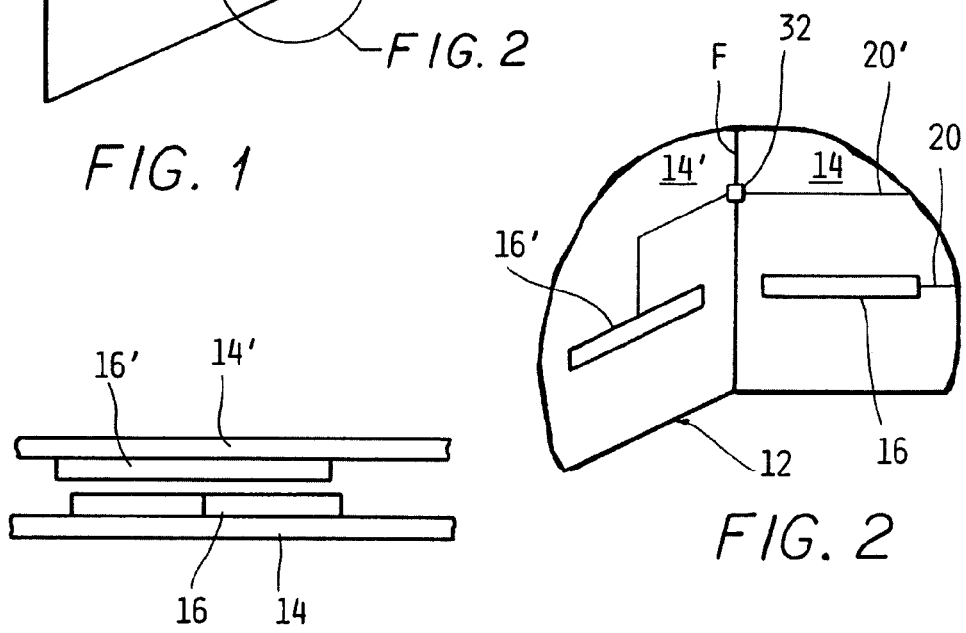
FIG. 2
FIG. 3
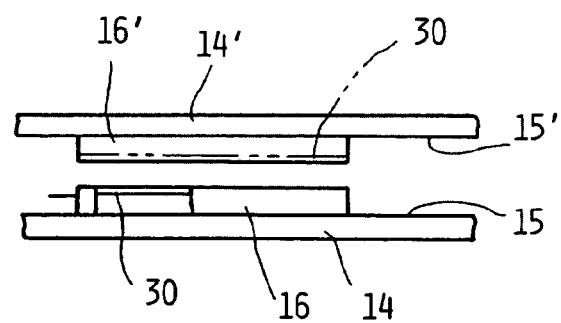
FIG. 4

PRINTED SENSOR HAVING OPPOSED AREAS OF NONVISIBLE CONDUCTIVE INK

The disclosed embodiments relate to sensor devices that can be employed in electronic circuits, particularly printed electronic circuits. More particularly, the embodiments disclosed relate to sensors or switch mechanisms that can be employed in devices including print media.

Electronic enhancements have been suggested for a variety of print media devices such as books, greeting cards and the like. The electronic enhancements suggested are used to provide visual enhancement or interest to printed material such as by animating text or graphic images. Electronically enhanced print media often employ mechanical switches or other mechanical devices in order to initiate the playback of sounds or performance of other electronic features. Such mechanically based switches are resource and space intensive. Thus, alternate switching and sensor mechanisms for use in conjunction with print media or various other applications where resource usage and/or space constraints could be desirable.

SUMMARY

Disclosed herein is a sensor/switching device configuration that includes a substrate and at least one element imprinted on the substrate which contains an electroconductive material. The element includes at least one active region surface configured in at least one of conductive mode, inductive mode, and capacitative mode and have at least one electroconductive material-containing element. The electroconductive material is usually indiscernible from the substrate.

BRIEF DESCRIPTION OF THE DRAWINGS

FIG. 1 is a perspective drawing of a greeting card including a sensor/switching device according to an embodiment as disclosed;

FIG. 2 is a detail drawing of a sensor/switching device element as employed in FIG. 1;

FIG. 3 is a cross-sectional view of sensor/switching device elements configured in the conductive mode depicted in FIGS. 1 and 2 in an overlying orientation as depicted in FIGS. 1 and 2;

FIG. 4 is a cross-sectional view of sensor/switching device elements configured in either a conductive or capacitive mode in an overlying orientation as depicted in FIGS. 1 and 2;

DETAILED DESCRIPTION

Figure 5:
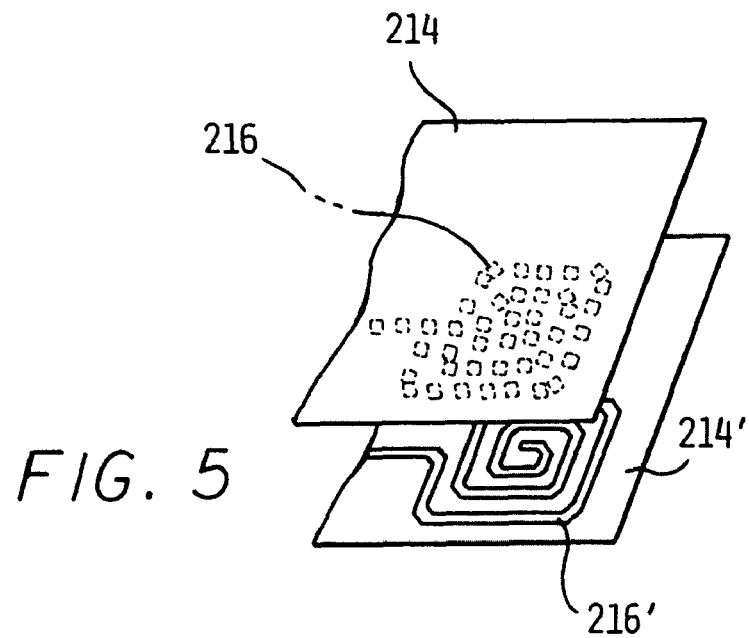
FIG. 5 is a sensor/switching device positioned on adjacent surfaces according to an embodiment disclosed herein to function in the inductive mode.

Disclosed is a sensor/switching device configuration that can be employed on and with various substrate materials. The sensor configuration can be employed in conjunction with suitable media such as print media. The print media may be interactive and/or electronically augmented or visually enhanced. It is also contemplated that the sensor/switching device configuration can be employed with other devices for which invisibility, or visual indistinctiveness is desired or required.

In its broadest sense there is disclosed a sensor/switching device mechanism that includes a substrate and at least one element imprinted on the substrate. The imprinted element contains electroconductive material. As defined herein the term "substrate" is taken to mean any solid material capable of receiving and maintaining a printed layer thereon. Materials of choice will be essentially non-conducting or will be capable of being rendered sufficiently insulative to permit the suitable function of electroconductive materials included in the imprinted layer. Suitable substrate materials can be flexible or rigid depending upon the end use to which the substrate material and associated printed material is to be put. Non-limiting examples of flexible materials include various grades and types of paper and paper products as well as plastics, plastic laminates and the like. Non-limiting examples of rigid substrates include wood, plastic structural material and the like.

As defined herein, the term "electroconductive material" is taken to mean a material capable of conducting or transferring at least a quantity of electrical charge sufficient to operate a power drawing device associated or connected with the sensor/switch or capable of being rendered so. The term "imprinted" as defined herein is taken to mean positioned on the substrate by means of a suitable deposition process such as by fluid jet deposition, and the like. Suitable electroconductive materials include, but are not limited to materials such as organic or inorganic materials or materials which can be rendered conductive by doping or by other processing applications or procedures and other electroconductive materials which can be deposited in similar manners.

Referring now to FIG. 1, there is depicted an animated greeting card 10 having a sensor/switching device 12 as disclosed herein. The greeting card 10 is considered as exemplary of the type of device or element which can utilize the sensor/switching device 12 as disclosed herein. The sensor/switching device may be used on other devices or apparatus having at least one substrate surface.

As depicted in FIG. 2, the sensor/switching device 12 includes a substrate 14 and at least one element 16 imprinted on the substrate. The imprinted element 16 contains a suitable electroconductive material. The substrate is one which will support the element 16 imprinted thereon. In the embodiment as illustrated in FIGS. 1 and 2, the substrate 14 can be suitable contiguous faces found on the surfaces of cardstock. It is also contemplated that the substrate 14 may be a specifically configured material that can be attached or imparted on the cardstock as desired or required. In a simple version as illustrated in FIG. 1, suitable substrate can be a folded greeting card with the sensor/switching device directly imparted thereon. Alternately, the substrate may be on which the sensor/switching device is imparted which is then attached or integrated into the larger device as desired or required.

The substrate material may be one which will support the element 16, 16'. The material of choice may be a random fiber product of any suitable thickness such as those derived from cellulose and cellulose analogs. Alternately, the material may be a woven or oriented fiber material or a suitable extruded or cast materials such as plastic or polymeric sheet material. The material chosen will be typically be one capable of receiving and supporting various visual indicia imparted on the surface of the substrate or integrated therein as by suitable printing techniques and the like. The substrate 14 as depicted in FIGS. 1 and 2 is an integral surface with the associated cardstock face. Where desired or required, it is contemplated that substrate 14 may be produced and positioned on an underlying support surface in a suitable manner.

In the greeting card 10 as depicted in FIGS. 1 and 2, the sensor/switching device 12 is in electronic contact with power source 18 and/or suitable logic devices or sensors 21 as desired or required. Examples of suitable power sources include, but are not limited to, batteries, solar cells, and the like. The power source 18 may be imprinted on, embedded in, attached to, or associated with the cardstock in any suitable fashion. The power source 18 will typically be invisible to the reader or viewer of the device. However, for purposes of clarity, the power source 18 is fully depicted in FIG. 1. Power source 18 is connected to suitable leads 22 communicating between the power source 18 and various illuminated or electro-luminescent features 24, 24' present on one or more surfaces. The leads 22 can be embedded or imprinted on the surface in any suitable manner.

In the sensor/switching device 12 as depicted herein, the element 16 can be imprinted or imparted on the substrate in any suitable manner. Thus, it is contemplated that the element 16 may be positioned on the substrate by methods such as, for example, ink transfer printing, screen printing or ink jet deposition, or by methods such as sputtering, vapor deposition, and the like. The element 16 can be configured in any suitable manner and will contain an electroconductive material at a position suitable to provide and support suitable sensor/switch function. The element 16 may be placed in communication with suitable power sources, logic devices etc as desired or required. As depicted in FIGS. 1 and 2, the element 16 is in electrical communication with the power source 18 and/or logic sensing circuit through lead 20. The lead 20 is a suitable trace associated with the substrate 14 and configured to facilitate electrical communication between the power source 18 and/or logic sensing circuit and the element 16. Lead 20 may be a nonwire based trace which may be positioned or suitably imprinted on the substrate and/or associated support surface by a suitable method such as ink transfer printing, screen printing, ink-jet deposition or by methods such as sputtering, vapor deposition, and the like. The lead 20 will have a suitable configuration and composition to permit organized conveyance of suitable electrical signals.

The sensor/switching device 12 may include a single element 16 or may include multiple elements as desired or required. As shown in FIGS. 1 and 2, the sensor/switching device 12 may be configured to include elements 16, 16', each associated with a respective substrate 14, 14'. The substrates 14, 14' are positioned in moveable relationship with one another. As depicted in FIGS. 1 and 2, the substrates 14, 14' are pivotally moveable relative to one another along fold line F.

In the greeting card as depicted in FIGS. 1 and 2, substrate 14, 14' is a heavy grade paper product having a fold F and elements 16, 16' disposed on opposite sides of fold F such that elements 16, 16' are brought into contact with one another when the card is in the closed position. Element 16 is an electrical communication with the power source 18 through lead 20. Element 16' is in electrical communication with power source 18 through lead 20'.

Elements 16, 16' can be configured in conductive mode as in FIG. 3. When substrate sections 14, 14' are folded together, elements 16, 16' are brought into electrical contact with each other permitting logic sensing element 21 to detect when the card is closed. When sensor/switch device 12 is configured as a capacitive device, element 16 and/or 16' may include a dielectric layer proximate to the conductive material shown at element 30 in FIG. 4. When the card is closed, logic sensing circuit 21 can be configured to detect the capacitative change in elements 16, 16' thus detecting an event such as when the card is opened or closed. The capacitative change may also be utilized to detect the status of the card, rate of change in movement of the two elements, etc. It is contemplated that one or more elements 16, 16' may be employed individually or in combination for a single or multi-stacked capacitor.

When the element 16, 16' is configured as a capacitor, it is contemplated that the element will include a plurality of electroconductive layers with suitable dielectric material interposed there between. As depicted in FIG. 4, the element 16, 16' includes an electroconductive layer positioned proximate to substrate 14.

It is contemplated that elements 16, 16' can be prepared by imprinting suitable conductive material such as electroconductive inks on the surface 15, 15' of substrate 14, 14'. The inks can be imprinted on the surface 15, 15' of substrate 14, 14' in any suitable manner such as by jetting, sputtering, chemical vapor deposition, or the like. The dielectric layer 30 may also be deposited over electrode 16, 16' in a like manner or in a different manner more suitable to the deposition of the dielectric layer chosen. In the device disclosed herein, it is contemplated that suitably precise application of the elements 16, 16', 30 can be accomplished by jet deposition.

Components such as first and second electrodes 16, 16' can be prepared from any suitable printable electroconductive material. Printable materials can include, but are not restricted to, pthalocyanines, pyrrones, indols, thiophenes, furans, polyphenylacetates, metallo-organics such as ZnO and $TiO_2$, and stearic acid. Examples of metallo-organics include, but are not limited to, indium tin oxide, zinc oxide, titanium dioxide and the like. Additional examples of conductive polymers include, but are not limited to, polyanalines, polyacetylenes, polythiophenes, polypyrroles, substituted pthalocyanines, trans-polyacetylene, poly (para-phenylenevinylene), and poly (para-phenylene).

Materials of choice are those which are transparent, translucent, or are essentially indistinguishable when deposited on the desired substrate. As used herein, the term "transparent" is defined as having properties which permit perception of underlying substrate or interposed materials therethrough. The "essentially indistinguishable" as that term is employed herein is taken to mean materials which are perceived as blending in or being usually consistent with the surrounding substrate and/or visual field. Translucent materials are those capable of permitting the passage of light. Optically transparent conductive materials such as those exhibiting better than 10 Ohms per square resistivity are of considerable interest in optoelectric devices. Examples of inorganic materials include ITO and $Z_nO$. Where high resistivity is acceptable, organic materials such as doped PEDOT and polyanaline may be employed to this end. Transparent conductive polymers can also be employed in the sensor/switching device as disclosed herein. These can include polyanalines including highly stretched materials as well as polyacetylene materials including iodine doped polyacetylene and starched ordered materials. Also useful are materials such as polythiophene polymers including stereoregular materials as well as polypyrrole and polysilane compounds which include modular sliylenes.

Conjugated polymers can also be utilized. Suitable conjugated polymers include pi-conjugated polymers consisting of a regularly alternating system of single carbon bonds and double bonds in an orientation which leads to a lower energy bandgap $E_g$ in the delocalized pi system. The necessary, but not significant, condition for conjugation is the alternation of the single and double bonds along the polymer backbone. The presence of pi electrons, the waveforms of which are delocalized over long portions of the polymer chain when the molecular structure of the backbone is at least approximately planar, provides the unique electronic properties of conjugated polymers. The essential properties of the delocalized pi-electron system are such that the electronic band gap is small (i.e. about 1 to 3.5 eV), and the polymer molecules can be relatively easily oxidized or reduced as through charge transfer with atomic or molecular dopant species, leading to conducting polymers. The net charge mobilities in the conducting state are large enough that high electrical conductivities are realized and the charge carrying species are not free electrons or holes, but are quasi-particles, which under certain conditions, move freely through the materials. Examples of suitable conjugated materials include, but are not limited to, trans-polyacetylene, polyacetylene, polyanilines, para-phenylenevinylene, poly (para-phenylenevinylene) and poly(para-phenylene).

Examples of particular materials that can be employed for characteristics of transparency or essential indistinguishability include but are not limited to inorganic compounds such as indium tin oxide, zinc oxide and variants as well as organic materials such as polyaniline, PEDOT and the like. It is contemplated that materials such as indium tin oxide, zinc oxide, and the like, can be efficaciously applied by sputtering or vapor deposition using masks to define the patterns desired. Development in printing materials using jetted means also holds promise, though selected material sets, including substrates, must withstand the required post production processes. Examples of such post-production processes include, but are not limited to, local laser curing and applied localized heating using suitable heating processes such as chemical and/or applied thermal means. Organic materials such as polyaniline and PEDOT can be applied by various imprinting techniques such as ink jet printing, screen printing and the like. Suitable dielectrics for use in the dielectric layer 30 include, but are not limited to butylcyclobutadiene, polymethylmethacrylate, polyamides, polysilane, glass-based materials, and the like.

It is also contemplated that suitable high temperature cure materials may be successfully deposited on low-temperature substrates and subjected to suitable localized curing processes that can include, but are not limited to, laser curing, localized exothermic chemical reactions, microwave curing, specific wave-length absorption, and the like. It is contemplated that suitable substrates can include various low temperature tolerant materials such as polyethylene and paper.

The element 16, 16' is electrically connected to a suitable lead, such as conductive trace 20, 20'. Conductive trace 20, 20' can be composed of any suitable organic or inorganic material imparted in or on the substrate that is capable of providing organized electrical/electronic communication between the element 16, 16' and a suitable power source such as battery 18 and/or logic sensing circuit.

The conductive trace 20, 20' may be imparted onto the substrate 14, 14' by any suitable method, one example of which is jet deposition. The conductive trace 20, 20' is integrated onto the surface 15, 15' of the substrate in a manner which permits and/or facilitates at least some limited flexing and movement of the substrate without unduly compromising electronic function. Additionally, conductive trace 20, 20' can include regions of reinforcement 32 to accommodate extensive bending and flexing as may be encountered at fold F.

As depicted in the drawing figures, conductive trace 20, 20' and element 16, 16' are depicted as visible elements. However, conductive trace 20, 20' and associated sensor elements 16, 16' are composed of materials which are transparent or can be rendered essentially indistinguishable through compatible pigmentation with the substrate and and/or associated printed regions so as to be essentially indiscernible to the viewer.

The term "essentially indistinguishable" as used herein is taken to define pigmentation or transparency, which renders the sensor element 16, 16' and/or conductive trace 20, 20' essentially indiscernible to the viewer. This can be accomplished by employing materials which are transparent and permit ready viewing of printing or other indicia that was previously imparted onto the substrate, as well as characteristics which are inherent in the substrate. It is also contemplated that the material can be rendered essentially indistinguishable through careful pigmentation or printing that is compatible and/or mimics the indicia or characteristics which underlie the sensor 16, 16' and/or conductive trace 20, 20'. Thus, where desired or required, the sensor 16, 16' and/or trace 20, 20' can have pigmentation imparted therein which approximates the hue or color tone of the substrate. It is also contemplated that the sensor 16, 16' and/or trace 20, 20' can include pigmentation variations to mimic underlying patterns or imparted indicia. Such variations can be ascertained by suitable mechanisms which include, but are not limited to, scanning mechanisms or the like operable with electronically controllable devices that can imprint or impart suitable compositions appropriately pigmented for the specific application. By way of nonlimiting example, a sensor device 16, 16' can be imparted over a printed region in a manner which mimics the underlying print to permit reading and enjoyment of the underlying area.

In the device depicted in FIGS. 1 and 2, the sensor 16, 16' can operate in a conductive, inductive or capacitive mode in various page turning applications such as a greeting card, book, or other bound codex device. It is also contemplated that the device can be incorporated into multiple adjacent surfaces.

As shown in FIG. 4, the sensor 16, 16' is positioned on adjacent substrates 14, 14'. The sensors 16, 16' may be configured to operate in a capacitive mode to provide proximity detection, displacement measurements, relative velocity, or acceleration measurements in systems such as alarm devices or the like. It is contemplated that sensor 16, 16' can be positioned on a suitable substrate 14, 14' by suitable imprinting or imparting methods. The substrate can be a suitable woven, polymeric, or cellulosic material as desired or required. Such assemblies can be incorporated into or imparted on a suitable surface for which detection or measurement is desired. It is also contemplated that the substrate 14, 14' can include at least one solid surface having suitable adhesion characteristics to receive the sensor device 16, 16' directly thereon. Thus, it is contemplated that at least one element of the sensory device 16, 16' can be imparted onto a solid surface such as a structural element such as glass, wood, metal, or the like. Preferably, the surface is a surface which is inherently nonconductive or can be rendered nonconductive in the region local to the sensor 16, 16' by administration of suitable insulative materials interposed between the surface and the element 16, 16'.

It is also contemplated that the device can be integrated to function in an inductive mode in adjacent surfaces as depicted in FIG. 5. The device configured to function in an inductive mode can include a primary sensor 216 and a secondary sensor 216' which are positioned in removable mating relationship on moveably adjacent surfaces 214, 214'. It is contemplated that the device can be used for proximity detection, displacement measurements, relative velocity calculations, acceleration measurements and the like as could be important in devices such as alarm systems, etc.

The device configured for inductive mode function can be incorporated onto a suitable substrate which is inherently nonconductive or can be rendered nonconductive at least in the area local to the sensor 216 by use of a suitable insulative material interposed between the sensor and the underlying substrate. A suitable insulative layer may also be deposited over sensors 216, 216' when they are in proximity to one another.

Figure 6:
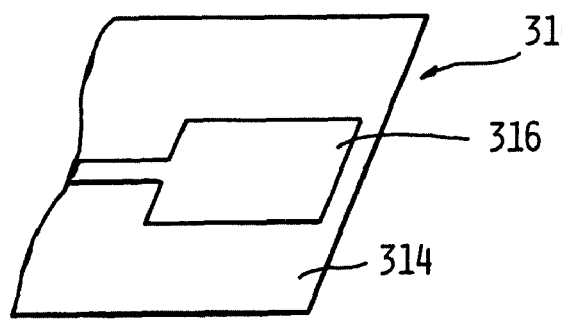
FIG. 6 is a sensor/switching device which includes a single electrode configured to function in the capacitive mode.

It is also contemplated that the sensor/switching device disclosed herein can be configured with a single electrode. When the sensor/switching device 310 is configured in the capacitive mode as a single electrode as in FIG. 6, it is contemplated that the device can be employed for functions such as proximity detection of adjacent electrical charge carrying material as may be employed in a finger sensor, metal sensor, or the like.

Where desired or required, the sensor 316 may be imparted on a substrate 314 which can be positioned or adhered to a suitable support member (not shown) to carry out the function desired. Alternately, the substrate 314 can be an integral material as in a paper sheet or the like.

Figure 7:
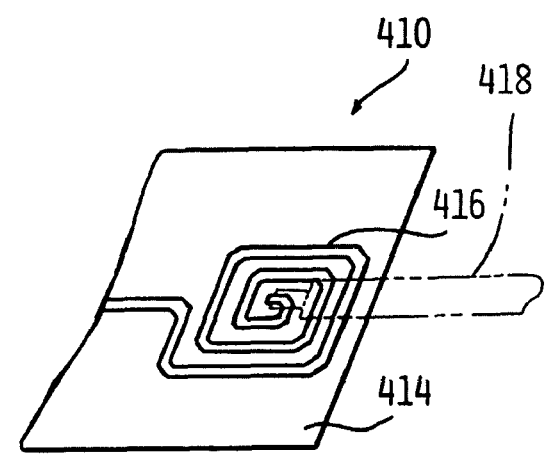
FIG. 7 is a sensor/switching device which includes a single electrode configured to function in the inductive mode.

It is also contemplated that the single electrode sensor/switching device 410 can be configured to function in the inductive mode as depicted in FIG. 7. Suitable electrodes 416 can be positioned on a suitable substrate 414 using suitably conductive inks which may be transparent or indiscernible to the viewer. The substrate 414 may be either a nonconductive material or one which can be rendered nonconductive by the interposition of suitable nonconductive materials. The substrate may function independently or may be one which can be attached or affixed to a suitable support member. It is contemplated that sensor 416 functioning in the inductive mode can be utilized for functions such as proximity measurement, displacement, velocity, or acceleration detection in materials that can carry induced currents as well as in a finger sensor arrangement, a magnetic field arrangement, or the like.

Figure 8:
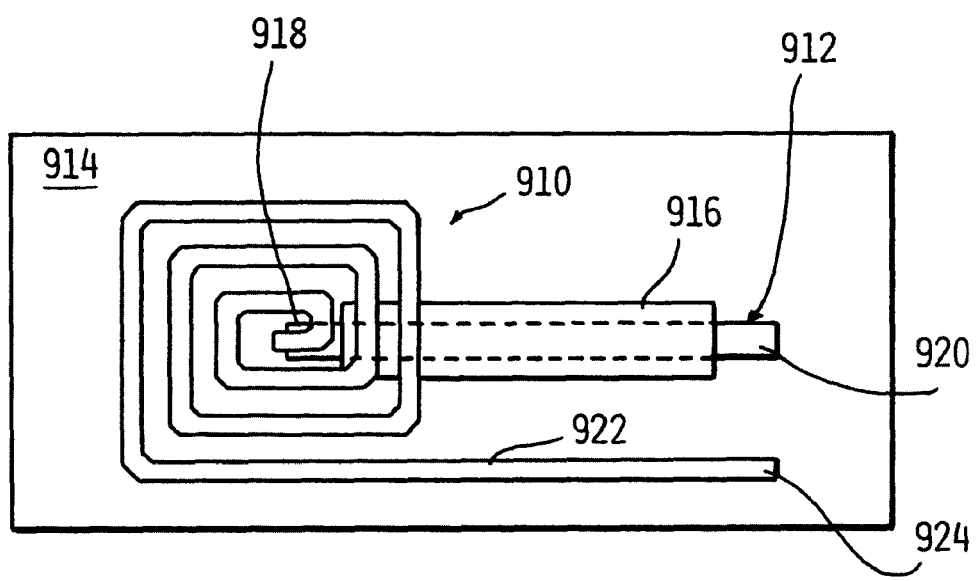
FIG. 8 is a detail of FIG. 7.

FIG. 8 shows schematic diagrams of an inductor 910. The inductor 910 comprises a first polymeric conductive layer 912 formed on surface 914. An insulator layer 916 overlies the conductive layer 914 in a manner which exposes contacts 918, 920 of conductive layer 912. A second polymeric conductive layer 922 is positioned in overlying relationship to the insulator layer and first polymeric conductive layer. The second polymeric conductive layer 922 forms a spiral having a center coincident with contact 918 and an end 924 aligned with contact 920. The size of the inductance of the inductor is determined by the number of "turns" of the spiral 922 and the material from which the insulator is formed.

It is contemplated that the sensor/switch device disclosed herein may be incorporated in an electronic device which may comprise "smart" sensing or actuating devices, elements, arrays, features, or structures. A "smart" or "intelligent" device is one with integration of a more complex level of pre- and main logic processing capability and, in some instances, memory function which can accomplish actions such as communications with other elements or devices. The degree to which data is interpreted or discriminated as by decision making capability, relative to another sensor/actuator or standard reference and errors or abnormalities can be compensated or eliminated leading to adaptation to the environment being sensed. This degree defines the level of "smartness" or intelligence. Thus, the sensor may be one which possesses a self-diagnostic capability or the like as desired or required.

Although the present inventions have been described in terms of preferred embodiments, numerous modifications and/or additions to the above-described preferred embodiments would be readily apparent to one skilled in the art. It is intended that the scope of the present inventions extend to all such modifications and/or additions.

What is claimed is:

1. A sensor comprising:
   a substrate including a first surface and a second opposite surface; and
   a first element imprinted on the first surfaces, the first element including first electroconductive material and being visually indiscernible from proximate portions of the first surface; and
   a second element imprinted on the second surface, the second element including a second electroconductive material and being visually indiscernible from proximate portions of the second surface.

2. The sensor of claim 1 wherein the first and second elements are in overlapping contact when the first and second surfaces are in overlying contact to one another.

3. The sensor of claim 1 wherein the first and second elements are in offset contact when the first and second surfaces are in overlying contact with one another.

4. The sensor of claim 1, wherein the first and second elements are transparent.

5. The sensor of claim 1 wherein the first and second elements are translucent.

6. The sensor of claim 1 further comprising:
   at least one lead in electronic communication with at least one of a power source and a logic circuit; and
   at least one lead in electronic communication with a power consuming device that is powered by the power source.

7. The sensor of claim 6 wherein the first and second surfaces are moveable relative to one another.

8. The sensor of claim 6 wherein the lead in communication with the power source is imprinted on the substrate and contains electroconductive material.

9. The sensor of claim 6 wherein the lead in communication with the power consuming device is imprinted on the substrate and contains electroconductive material.

10. The sensor of claim 6 further comprising a switch, the switch associated with and controlled by the logic circuit.

11. The sensor of claim 1 wherein the active region is configured in an inductive mode.

12. The sensor of claim 1 wherein the active region is configured in a capacitive mode.

13. The sensor of claim 1 wherein the substrate comprises:
   a first panel providing one of the two opposed surfaces; and
   a second panel providing the other of the two opposed surfaces, wherein the first panel and the second panel are pivotally coupled to one another.

14. The sensor of claim 13 further comprising at least one of an alphanumeric symbol and a graphic imprinted upon the first panel.

15. The sensor of claim 13 wherein the first panel and the second panel are joined by a fold.

16. The sensor of claim 1, wherein the substrate is opaque.

17. A sensor imprintably positioned on a substrate, the sensor comprising:
a first element containing electroconductive material;
a second element selectively movable into and out of contact with the first element;
at least one power source in electrical communication with one of the first and second elements; and
at least one power consuming device in electrical communication with the other of the first and second elements, wherein the power source and power consuming device are in electrical communication when the first and second elements are in contact with one another and wherein the electroconductive material in the first elements is visually indiscernible from the substrate.

18. The sensor of claim 17 further comprising a logic and sensing circuit, wherein the first and second elements are in communication with the logic and sensing circuit in a manner which detects contact between the first and second elements.

19. The sensor of claim 18 further comprising a switch associated with the logic and sensing circuit.

20. The sensor of claim 18 wherein the first and second elements are positioned on the substrate such that the first and second elements are in opposed contact with one another.

21. The sensor of claim 18 wherein the first and second elements are positioned on the substrate such that the first and second elements are in offset contact with one another.

22. The sensor of claim 17 wherein the electroconductive material in at least one of the first and second elements is transparent.

23. The sensor of claim 17 wherein the electroconductive material in at least one of the first and second elements is translucent.

24. A device having at least two surfaces in moveable relationship to one another, the device comprising:
a first substrate associated with a first surface having an outwardly oriented surface;
a second substrate associated with a second surface having an outwardly oriented surface in removable overlying relationship to the first surface;
at least one electrically active element imprinted on at least one of the first and second substrates, the electrically active element having at least one region of electroconductive material, wherein at least a portion of the region of electroconductive material is visually indiscernible relative to the associated substrate.

25. The device of claim 24 wherein the at least one electrically active element includes a first element imprinted on the first substrate and a second element imprinted on the second substrate, wherein the first element and the second element are in removable contact with one another and wherein the first element is visually indiscernible relative to the first substrate and the second element is visually indiscernible relative to the second substrate.

26. The device of claim 25 further comprising logic and sensing circuitry in electronic communication with the first and second electrically active elements, the sensing circuitry configured to sense or detect at least one of electroconductive element proximity, electroconductive element contact, electroconductive element movement, electroconductive contact acceleration, and electroconductive contact velocity.

27. The device of claim 24 wherein the electroconductive element is at least one of a capacitor, a conductor, and an inductive circuit.

28. The device of claim 24 further comprising a power source and at least one lead connected to the power source and the electrical element imprinted on the surface of the substrate.

29. The device of claim 28 wherein the power source is located in one of the substrates.

30. The device of claim 28 further comprising at least one logic and sensing circuit and at least one switch in electronic communication with the power source and the electrically active element, the logic and sensing circuit adapted to sense or detect at least one of electroconductive element proximity, electroconductive element contact, electroconductive element movement, electroconductive contact acceleration, and electroconductive contact velocity.

31. The device of claim 25 wherein the electroconductive elements are in opposed removable contact with one another.

32. The device of claim 25 wherein the electroconductive elements are in offset removable contact with one another.

33. The device of claim 24 wherein the electroconductive element is at least one of a capacitor, a conductor and an inductive circuit.

34. The device of claim 33 wherein the electroconductive element is in electronic communication with logic and sensing circuitry.

35. The device of claim 34 further comprising a power source and at least one lead connected to the power source and the electrical element imprinted on the surface of the substrate.

36. The device of claim 35 wherein the power source is located in one of the substrates.

37. The device of claim 34 wherein the electroconductive region comprises an electroconductive ink.

38. The device of claim 37 wherein the electroconductive ink is transparent.

39. The device of claim 37 wherein the electroconductive ink is translucent.

40. The device of claim 35 further comprising at least one power source, the power source in communication with the electrically active element.

41. The device of claim 35 wherein at least one of the first substrate and the second substrate is composed of a flexible nonconductive material including at least one of paper, plastic, and woven fabric.

42. The device of claim 35 wherein the first and second substrates are integrated into a codex.

43. The device of claim 35 wherein the first and second substrates are integrated into a flexible sheet having at least one fold region between the first and second substrates.

44. The device of claim 35 further comprising:
electro-luminescent features; and
a control mechanism for illuminating the electro-luminescent features.

45. The device of claim 44 wherein the illumination control mechanism comprises a device for storing and retrieving preprogrammed logic.

46. A sensor comprising:
at least one element containing at least one electroconductive material and at least one active region configured in at least one of inductive mode and capacitive mode; and means for supporting the element, wherein the element is visually indiscernible from the support means.

47. A sensor comprising:
a substrate; and
at least one element imprinted on the substrate, wherein the element is visually indiscernible from the substrate, the element containing at least one electroconductive material and having an active region configured in an inductive mode.

48. A sensor comprising:
a substrate; and
at least one element imprinted on the substrate, wherein the element is visually indiscernible from the substrate, the element containing at least one electroconductive material and having an active region configured in an capacitive mode.

* * * * *